United States Patent
Islam et al.

(10) Patent No.: US 10,431,675 B1
(45) Date of Patent: Oct. 1, 2019

(54) SINGLE WALLED CARBON NANOTUBE TRIODE

(71) Applicant: Government of the United States as represented by the Secretary of the Air Force, Wright-Patterson AFB, OH (US)

(72) Inventors: Ahmad Ehteshamul Islam, Beavercreek, OH (US); Benji Maruyama, Yellow Springs, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 0 days.

(21) Appl. No.: 14/600,380

(22) Filed: Jan. 20, 2015

(51) Int. Cl.
    *H01L 29/775* (2006.01)
    *H01L 29/66* (2006.01)
    *H01L 29/06* (2006.01)
    *H01L 21/02* (2006.01)
    *H01L 21/762* (2006.01)

(52) U.S. Cl.
    CPC ...... *H01L 29/775* (2013.01); *H01L 21/02118* (2013.01); *H01L 21/02282* (2013.01); *H01L 21/76251* (2013.01); *H01L 29/0669* (2013.01); *H01L 29/66045* (2013.01)

(58) Field of Classification Search
    CPC ............. H01L 29/775; H01L 21/02118; H01L 21/02282; H01L 21/76251; H01L 29/0669; H01L 29/66045
    USPC ... 257/9, 20, 29, 76, 77, 302, 329–331, 368, 257/613; 977/734, 742, 749
See application file for complete search history.

(56) References Cited

U.S. PATENT DOCUMENTS

| | | | | |
|---|---|---|---|---|
| 6,780,663 | B2 * | 8/2004 | Park | B82Y 10/00 313/238 |
| 6,897,009 | B2 * | 5/2005 | Johnson, Jr. | B82Y 10/00 257/E21.036 |
| 7,102,157 | B2 * | 9/2006 | Kastalsky | B82Y 10/00 257/40 |
| 7,322,869 | B2 * | 1/2008 | Chao | B82Y 10/00 313/310 |
| 8,115,187 | B2 * | 2/2012 | Segal | H01J 3/021 257/4 |
| 8,367,035 | B2 | 2/2013 | Rogers et al. | |
| 8,728,880 | B2 * | 5/2014 | Chung | H01L 29/42384 257/29 |
| 2002/0067114 | A1 * | 6/2002 | Choi | B82Y 10/00 313/310 |
| 2006/0175952 | A1 * | 8/2006 | Lee | B82Y 10/00 313/311 |
| 2007/0014151 | A1 * | 1/2007 | Zhang | B82Y 10/00 365/185.01 |

(Continued)

*Primary Examiner* — Ori Nadav
(74) *Attorney, Agent, or Firm* — AFMCLO/JAZ; James F. McBride

(57) ABSTRACT

A carbon nanotube triode apparatus includes a plurality of Horizontally Aligned Single Wall Carbon Nano Tubes (HA-SWCNT) disposed on an electrically insulating thermally conductive substrate. A first contact is disposed on the substrate and electrically coupled to a first end of the HA-SWCNT. A second contact is disposed on the substrate and separated from a second end of the HA-SWCNT by a gap. A gate terminal is coincident with a plane of the substrate.

7 Claims, 4 Drawing Sheets

(56) References Cited

U.S. PATENT DOCUMENTS

| | | | |
|---|---|---|---|
| 2007/0285843 A1* | 12/2007 | Tran .................. | B82Y 10/00 360/245.9 |
| 2008/0122335 A1* | 5/2008 | Liu ................... | H01J 1/316 313/292 |
| 2009/0298994 A1* | 12/2009 | Dubois ............. | B82Y 30/00 524/495 |
| 2010/0007263 A1* | 1/2010 | Wei ................... | H01J 3/021 313/309 |

* cited by examiner

SINGLE WALLED CARBON NANOTUBE TRIODE

RIGHTS OF THE GOVERNMENT

The invention described herein may be manufactured and used by or for the Government of the United States for all governmental purposes without the payment of any royalty.

FIELD OF THE INVENTION

The present invention relates generally to three terminal devices and their fabrication and, more particularly, to devices using electrostatic gate control thereof.

BACKGROUND OF THE INVENTION

Moore's Law, related to the scaling of electronic devices, postulates that the number of field effect transistors (FETs) in dense integrated circuits will double approximately every two years. While this prediction has held true for many years, dimensional limitations will likely make it impossible to keep up with this historical rate of growth.

Many alternative means of enhancing device performance are currently being explored. Some use novel materials such as carbon nanomaterials, metal dichalcogenides, and the like as channels for FET and alternative device architectures. Alternative device architectures may include, tunnel FET, micro-electro-mechanical switches, single electron transistors, molecular switches, etc. All of these proposed changes are aimed at emulating the switching properties of FETs at smaller size-scales. Research in these areas is evolving, though few have shown any promising solutions thus far. On the other hand, there have been some recent efforts in using the pre-silicon era triode devices in nanoscale format to enable ballistic transport of carrier in atmospheric condition from one contact to the other.

A traditional triode is an evacuated tube device having three elements: a cathode filament, a control grid, and an anode plate (just as the "di" in the name diode refers to two elements, filament and plate). While the device was the de-facto standard prior to widespread uses of the FET, the triode suffered from relatively high current consumption (as a result of the resistive heated filament. Additionally, switching speeds were limited to a fraction of what is often required by today's design requirements. Of course, perhaps one of the greatest limitations was size; having a footprint thousands of times larger than a comparable FET.

However, if a nano-structure could be fabricated to mimic the desirable features of the triode, many of the former limitations would be obviated. Some attempts to emulate the triode in a nano-form-factor have included contacts spaced in the range of 20-150 nm. That spacing dimension is much smaller than the mean free path of electrons in atmospheric condition. As a result, application of bias across the contact enables field emission of electron from anode that transports to cathode in a ballistic manner. Using appropriate gate structure, the field emission can be switched on/off, to mimic the same operation in a FET or a tube triode. Existence of ballistic transport (i.e., the highest possible mobility) in these nanoscale triodes, even at length scales of ~100 nm, promises to have significant performance improvement over any of the existing FET configuration reported so far.

Unfortunately, performance in these nanoscale triode are currently limited because of (a) low field emission from the smaller aspect ratio structures being used, (b) high gate current (since field emissions from the cathode are diverted from anode to gate), and (c) thermal runaway when operated at higher current levels. Therefore, these triodes show limitation in scaling them down to the nanometer regime as needed for high performance applications.

As a result, there exists a need in the art for low power consumption nanoscale triode having sufficient field emissions and manageable heat generation properties.

SUMMARY OF THE INVENTION

The present invention overcomes the foregoing problems and other shortcomings, drawbacks, and challenges of surpassing the performance plateau of current semiconductor devices. While the invention will be described in connection with certain embodiments, it will be understood that the invention is not limited to these embodiments. To the contrary, this invention includes all alternatives, modifications, and equivalents as may be included within the spirit and scope of the present invention.

According to one embodiment of the present invention a method of manufacturing a carbon nanotube triode is provided. The method includes growing a plurality of Horizontally Aligned Single Wall Carbon Nano Tubes (HA-SWCNT) on a first substrate. The method further includes drop casting and curing a polymer on the first substrate and the HA-SWCNT. The method also includes transferring the cured polymer and the HA-SWCNT to a second substrate. A first contact and a second contact are deposited at a first end and a second end of the HA-SWCNT, respectively. The method further includes etching the HA-SWCNT from the periphery of the triode, and etching a gap between the second contact and the HA-SWCNT proximate the second end.

According to another embodiment of the disclosed invention, a carbon nanotube triode apparatus is provided. The apparatus includes a plurality of Horizontally Aligned Single Wall Carbon Nano Tubes (HA-SWCNT) disposed on an electrically insulating thermally conductive substrate. A first contact is disposed on the substrate and electrically coupled to a first end of the HA-SWCNT. A second contact is disposed on the substrate and separated from a second end of the HA-SWCNT by a gap. A gate terminal is coincident with a plane of the substrate.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

Figure 1A:
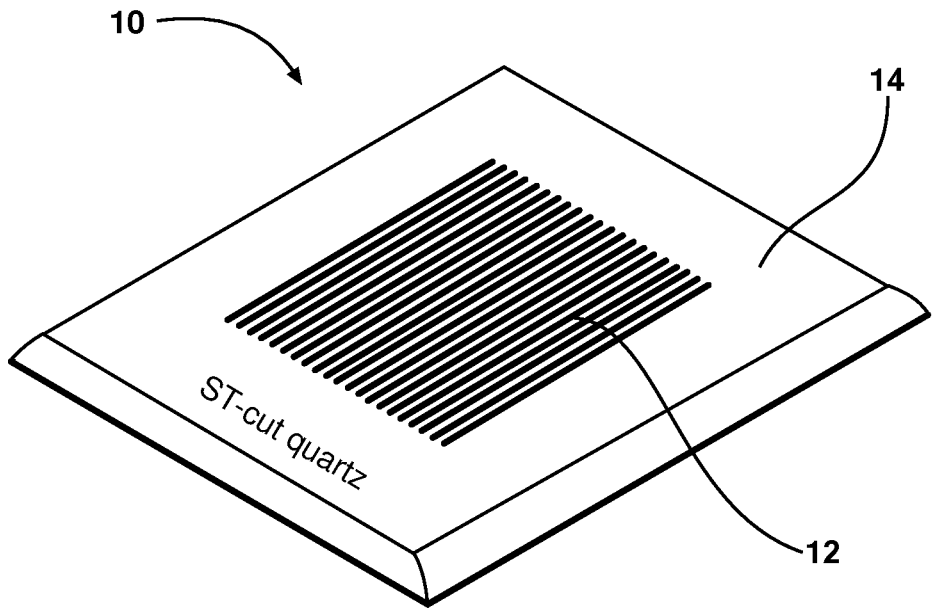
FIGS. 1A through 1D illustrate steps of manufacturing a triode in accordance with embodiments of the disclosed invention.

FIGS. 1A through 1D illustrate steps of manufacturing a disclosed triode apparatus 10 according to an embodiment of the disclosed invention. Turning attention to FIG. 1A, Horizontally Aligned-Single Walled Carbon Nano Tubes (HA-SWCNT) 12 is grown on first substrate 14. In some embodiments, the first substrate 14 may be stable temperature (ST) cut quartz. The HA-SWCNTs 12 may be grown by using parallel bands of catalyst to influence nanotube orientation. A detailed description of HA-SWCNT fabrication may be found in U.S. Pat. No. 8,367,035. Certain embodiments of the disclosed invention may use polished sapphire, or other suitable first substrate 14 in lieu of quartz. A polymer is applied to the first substrate 14 and HA-SWCNT 12. In some embodiments, Polyvinyl alcohol (PVA) with 10% molecular weight is drop-cast on the HA-SWCNT 12 and first substrate 14. The PVA is cured or polymerized by using a hotplate at approximately 60° C., which yields an approximately one μm thick film on the HA-SWCNT 12. This cured PVA along with HA-SWCNT 12 is then transferred with 120° C. thermal release tape or other suitable transfer mechanism from the first substrate 14 to a second substrate 16. In some embodiments, the second substrate 16 may be a highly-doped p-type silicon substrate that includes approximately 100 nm surface coating of thermal oxide. Further, in some embodiments of the disclosed invention, the second substrate 16 may be $SiO_2$. After completing the transfer, the PVA is gently washed using drops of distilled water.

Figure 1B:
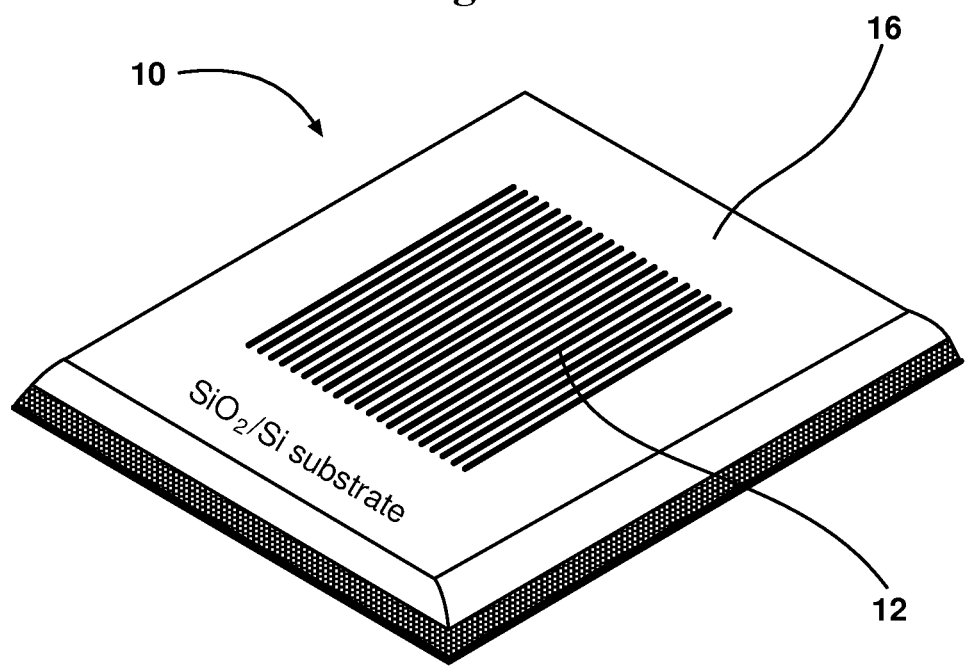
Figure 1C:
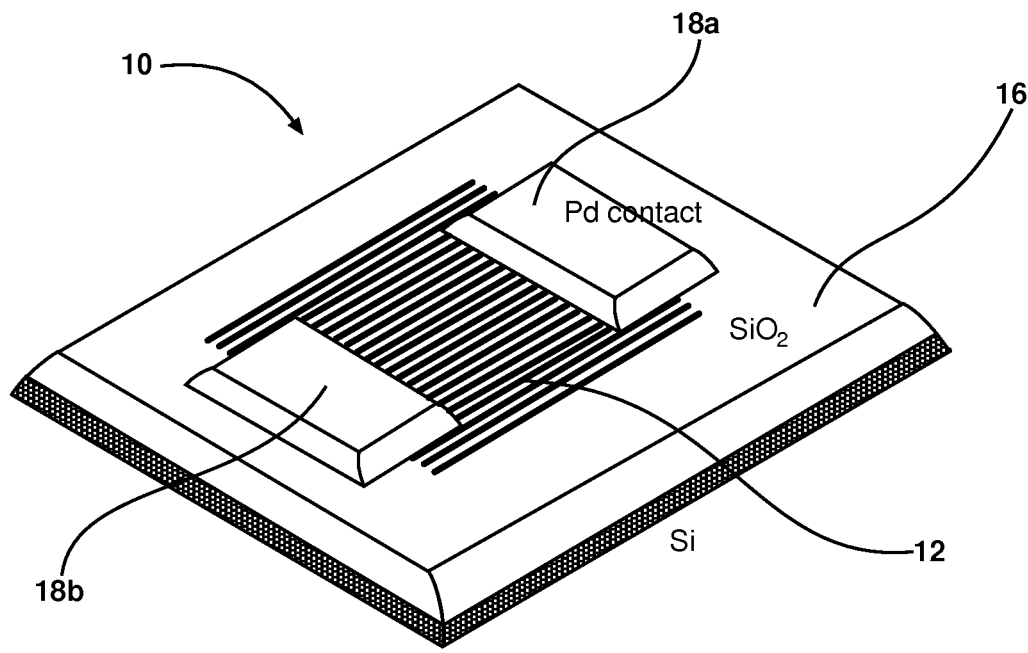
Figure 1D:
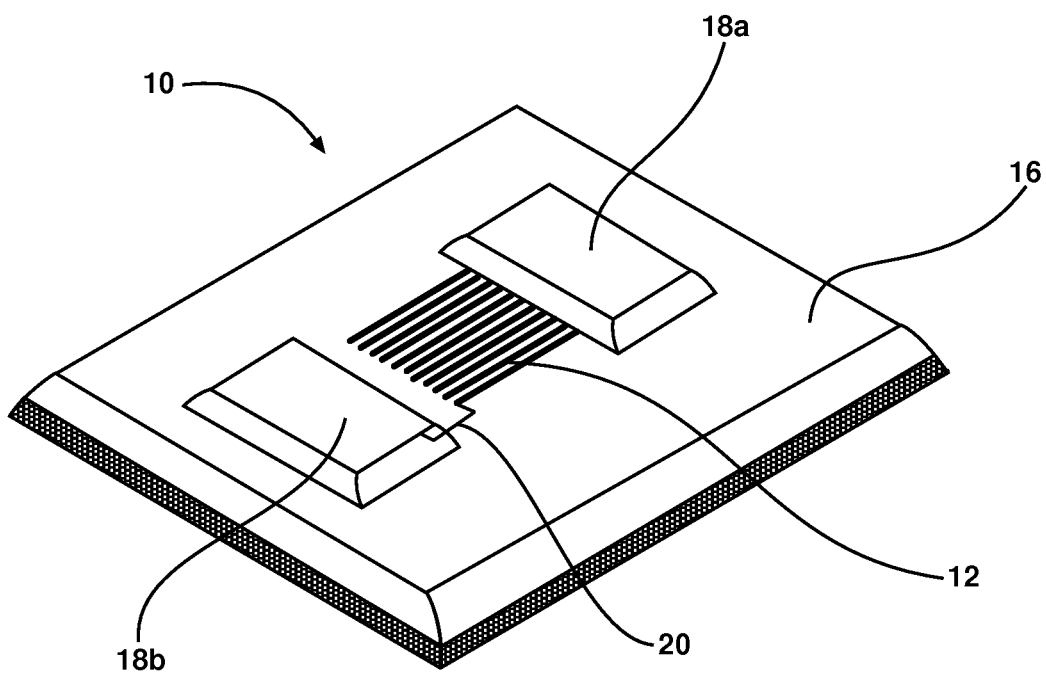

The transfer step leaves HA-SWCNT 12 on top of the thermal oxide layer of the receiving second substrate 16 as illustrated in FIG. 1B. As detailed in FIG. 1C, contacts 18a and 18b of approximately 40 nm conductive metal are then deposited via electron-beam evaporation (a 1.5 nm titanium layer may be included to enhance adhesion of the contact with the $SiO_2$ second substrate 16) in regions defined by photolithography. In some embodiments of the disclosed invention, palladium may be used. Etching of the HA-SWCNT 12 may be performed with $O_2$ plasma to remove HA-SWCNT from undesired locations, as seen in FIG. 1D. In some embodiments of the disclosed invention, the etching chamber is configured to etch at 20 sccm, 100 W, 100 mTorr, for 20 sec. The HA-SWCNT 12 is etched from the periphery of the device. In addition, a nano-gap 20 is etched between the HA-SWCNT and the second contact 18b. In the completed triode 10, the HA-SWCNT 12 serves as the cathode and the Pd contact 18b serves as the anode.

In some embodiments of the disclosed invention, other high-κ dielectrics may be used in lieu of $SiO_2$. Suitable high-κ dielectrics for use with the second substrate 16 include, by way of example, oxides, nitrides, or oxynitrides of: hafnium, zirconium, aluminum, titanium, yttrium, or lanthanum. Fabrication steps for these additional embodiments are similar to the steps illustrated in FIGS. 1A and 1C-1D, however, with respect to the step illustrated by FIG. 1B, HA-SWCNT 12 transfer may be performed on high-κ dielectrics grown epitaxially on gate metals via atomic layer deposition (ALD) or other suitable means.

The triode 10 takes advantage of carbon nanotubes' largest achievable aspect ratio. SWCNTs can have longer length (>100 μm) and smaller diameters (approximately one nm), when grown on quartz or sapphire substrates. When nanotubes lay horizontally on the substrate in an aligned manner, parallel to each other (the energetics of the quartz substrates allow alignment of multiple nanotubes in one preferential direction), it yields a configuration that is ideal for having higher field emission from multiple nanotubes to a metal contact that can be placed approximately a few nanometers away from the tip of the nanotube. In some embodiments, upon improved fabrication resolution, the metal contact may be one nm, or a fraction of a nm, away from the tip of the nanotube. Field emissions from these nanotubes and ballistic transport of emitted electrons to the metal contact 18b can be performed not only on the substrates like quartz or sapphire on which nanotubes are grown (first substrate 14), but also on other insulating substrates like $SiO_2$ to which the nanotubes can be transferred (second substrate 16). Close proximity of the nanotubes and the substrates like quartz, sapphire, or $SiO_2$ will help the nanotubes to dissipate heat easily into either the first substrate 14 or the second substrate 16 with equal efficiency and hence avoid thermal runaway during field emission.

With particular reference to the triode 10 as described above, the HA-SWCNT 12 serves as a cathode, and the metal contact 18b serves as an anode. The anode-cathode (A-C) distance gap 20 is on the order of nanometers. More specifically, the A-C distance in the disclosed invention is only limited by the resolution of e-beam lithography (approximately sub-10 nm, as par state-of-art lithography tools) and focused ion beam (<25 nm, as par currently available tools) that can be used for generating the nano-gap 20 between HA-SWCNT 12 and the metal contact 18b. Electrostatic control of the field emission can be performed by placing HA-SWCNTs 12 with metal (palladium or other suitable ones) contacts 18a and 18b on a bottom-gated geometry that has oxide (second substrate 16 fabricated from $SiO_2$ or other suitable ones) on metals or on highly doped silicon.

Increased length of the HA-SWCNTs 12 will increase the aspect ratio and will likewise create more field emission and result in higher current. However, it should be noted that if the spacing between HA-SWCNTs 12 are reduced, the field emission from individual nanotubes will reduce (though total emission will increase, because of having larger number of HA-SWCNTs 12 in the device). Is should be further noted that, the width of contacts 18a and 18b will not affect device performance. However, the spacing between the HA-SWCNTs 12 will affect performance A smaller spacing between HA-SWCNTs 12 (that is, higher density per um, counted along the line across its alignment) will proportionately increase the current of the device. The present achievable spacing of approximately 50-100 nm produces acceptable results.

Figure 2A:
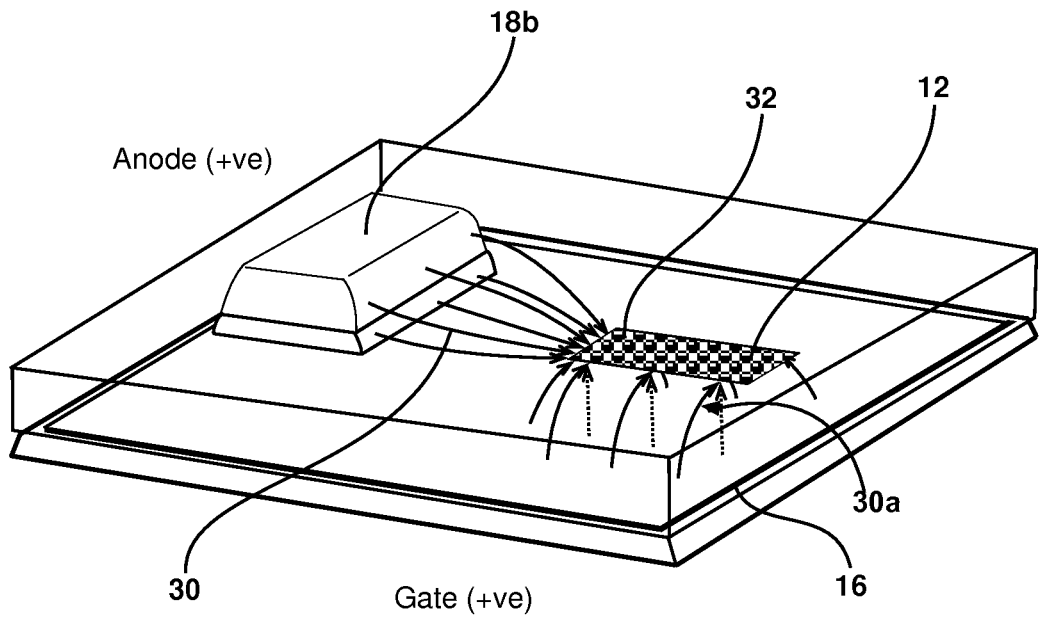
FIGS. 2A-2C illustrate principles of operation of an embodiment of the disclosed invention.

The principle of operation of the disclosed triode 10 is as follows. Switching operations may be performed with three terminals. One of the metal contacts 18b that is separated from the HA-SWCNT 10 by a nano gap 20 works as the anode terminal, HA-SWCNT 12 connected with the other metal contact 18a serves as the cathode terminal, and the highly doped silicon (or other suitable material as the second substrate 16) as the gate terminal. As illustrated in FIG. 2A using a single HA-SWCNT 12, during on-state of the triode 10 with anode (contact 18b) and gate (second substrate 16) having +ve bias and with the cathode (HA-SWCNT 12) grounded, the electric field lines 30 from anode (contact 18b) are concentrated near the tip 32 of HA-SWCNT 12 and electric field 30a lines from the gate (second substrate 16) is concentrated along the length of the HA-SWCNT 12. The field lines from gate 30a increase the density of electrons on the HA-SWCNT 12 and the field lines from anode 30 creates a large potential gradient at the tip 32 to enable field emission of electrons from the tip of HA-SWCNT 32 through Fowler-Nordheim tunneling and thermal emission (See FIG. 2C). The latter (thermal emission) happens only when the HA-SWCNT 12 is heated during high current operation. Due to the image charge effect 34 near the tip 32 of the HA-SWCNT 12, the energy barrier for Fowler-Nordheim tunneling and thermal emission is lower than the values obtained from simple band alignment 36 (see FIG. 2C).

Figure 2B:
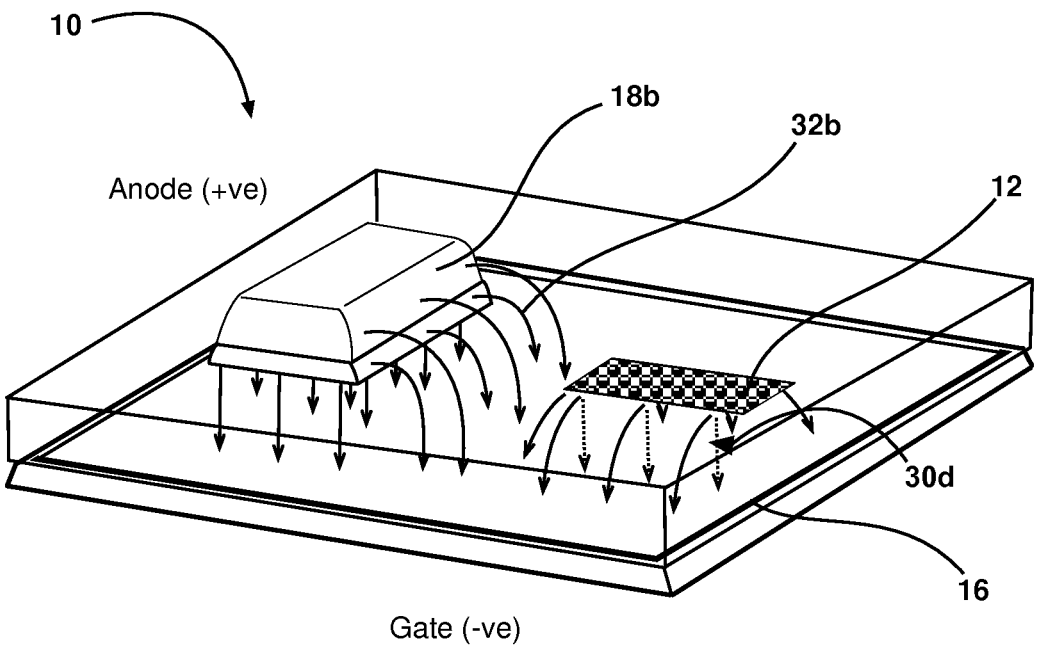
Figure 2C:
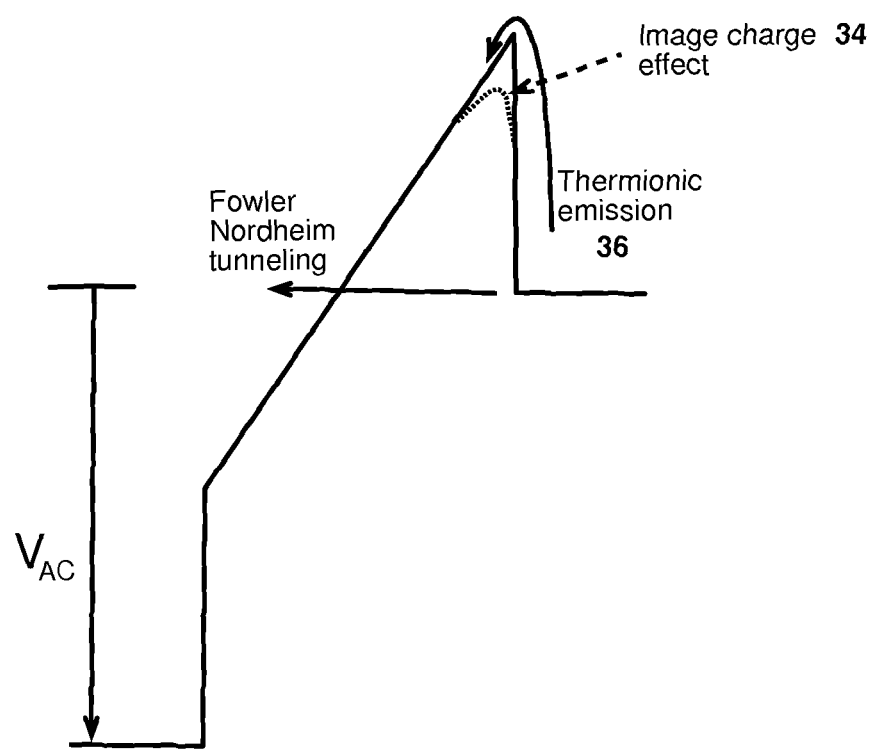

Field emission of electrons through electric field lines 30 from HA-SWCNT 12 can be turned off by applying −ve voltage to the gate terminal (second substrate 16), while keeping the other terminals (18a and 18b) at the same voltage as in on-state. As illustrated in FIG. 2B, during off-state of the triode 10, electric field lines 30c and 30d from both anode 18b and cathode 12 are directed away from them in such a way that there is depletion of electrons (because of −ve gate voltage) along HA-SWCNTs and negligible electric field near the tip of HA-SWCNTs 12. This ensures no field emission 30c and 30d from cathode 12 to anode 18b. Such electrostatic control of field emissions 30c and 30d is different from the field emission screening that is normally performed in in classical vacuum tube triodes using grids. It also differs from prior art nanotube-based embodiments having a gate terminal disposed between cathode tip 32 and anode 18b. Such field emission screening by using a gate in between cathode tip 32 and anode 18b results high gate current in the off-state, because application of off-state gate bias (generally +ve) in such configuration diverts field-emitted electron from cathode tip 32 to the gate terminal 16. This prior art technique increases off-state gate 16 current and reduces the anode 18b current. In contrast, electrostatic gate control in the proposed triode 10 configuration ensures negligible gate 16 current in both on- and off-state through direct tunneling of electrons/holes across $SiO_2$ (as configured here) to the gate or second substrate 16. Such gate current can be controlled by using $SiO_2$ having a thickness greater than 5 nm or by using high-κ gate dielectrics.

The disclosed triode 10 may be a suitable substitute for the present day field effect transistor that serves as the fundamental building block of electronics with applications such as digital switches (logic gates, oscillators, random access memories, microprocessors, and the like), analog electronics (amplifiers, phase shifters, oscillators, etc.), radio-frequency or RF electronics (amplifiers, modulators, filters, encoders, radar, etc.), large-area flexible electronics, biological species (DNA, protein, microbial, etc.) sensing, and chemical species (humidity, $CO_2$, $O_2$, etc.) sensing. Use of the disclosed triode 10 will allow for advances in these applications by reducing the physical footprint while reducing power consumption. In digital/analog/RF electronics, the availability of ballistic transport of electrons from HA-SWCNT tip 32 to metal contact 18b, as well as high throughput from each SWCNT with larger aspect ratio, will ensure faster operation of the triode with less power consumption. In addition, the disclosed invention may be used to obtain gate controllable field emission in geometrically flexible substrates. In biological and chemical sensing, the disclosed triode 10 will exploit the high surface to volume ratio and high sensitivity of SWCNT. Different biological and chemical species have demonstrated capabilities of modulating conductivities of SWCNT, and therefore will also modulate the transport through the triode 10.

In contrast to prior art devices, the disclosed triode 10 has the added advantages of yielding enhanced field emissions from high aspect ratio HA-SWCNTs 12, greater sensitivity to biological and chemical species, and capability for doping HA-SWCNTs 12 to control conduction. These attributes complement the primary advantage of having field emitters on thermally conducting substrates that enables reduced thermal runaway and hence higher device lifetime.

The disclosed triode 10 uses gate-controlled field emission from HA-SWCNT 12 grown on ST-cut quartz (first substrate 14). Though the use of HA-SWCNT 12 ensures efficient field emission as a result of the high aspect ratio, many alternative embodiments of the triode 10 can be produced by replacing HA-SWCNT 12 with multi-wall carbon nanotubes, nanowires, carbon nano fibers, boron nitride nanotubes, zinc oxide nano rods/nanowires, and the like. The varied field emission from these nanostructures may be used to meet design considerations compared to that from HA-SWCNT resulting from the change in aspect ratio and electrical/thermal conductivities.

Other embodiments include using a first substrate 14 other than ST-cut quartz. These include different other cuts (X-, Y-, Z-cuts, etc.) of quartz, different cuts (A-, C-cut, etc.) of sapphire, and silicon with appropriate insulators. In addition, instead of lying in direct physical contact with the insulator, HA-SWCNT 12 can be suspended over a trench or undercut region. Such embodiments having a portion of unsupported HA-SWCNT 12 may yield different thermal properties to meet design considerations different from those achieved by other embodiments of the disclosed invention.

In addition to its application as a replacement of current-day field effect transistor, the proposed configuration can also be used to create tunable microplasmas near the tip 32 of HA-SWCNT 12 by applying high frequency (approximately MHz range) AC signal across cathode and anode (as VAC), while keeping the triode 10 in an inert medium of argon or nitrogen at atmospheric pressure. Such tunable microplasmas have applications in metamaterials, reconfigurable antennas, energy efficient lighting, displays, and in many other areas of plasmonics. Moreover, the disclosed invention enables generation of tunable microplasmas in flexible substrates. Finally, with appropriate protection or chemical modification, microplasma generated from the disclosed invention could be used in hostile physical environments, including high altitude, low earth orbit, or in general poor vacuum conditions.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A carbon nanotube triode apparatus, the apparatus comprising:
   a plurality of Horizontally Aligned Single Wall Carbon Nano Tubes (HA-SWCNT) disposed on an electrically insulating thermally conductive layer of a substrate;
   a first contact disposed on the substrate and electrically coupled to a first end of the HA-SWCNT, wherein the first contact is disposed overlapping the first end of the HA-SWCNT in a view perpendicular to the electrically insulting and thermally conductive layer;
   a second contact disposed on the substrate, said second contact being entirely separated from the HA-SWCNT by a gap in the view perpendicular to the electrically insulating and thermally conductive layer; and
   a gate terminal coincident with a plane of the substrate below the electrically insulating and thermally conductive layer.

2. The apparatus of claim 1, wherein the electrically insulating and thermally conductive layer of the substrate comprises Si, a portion of the Si forms a $SiO_2$ layer of approximately 100 nm.

3. The apparatus of claim 1, wherein the electrically insulating and thermally conductive layer of the substrate is selected from the group consisting of oxides, nitrides, or oxynitrides of: hafnium, zirconium, aluminum, titanium, yttrium, or lanthanum.

4. The apparatus of claim 1, wherein the gap is between approximately 30 nm to approximately 10 nm.

5. The apparatus of claim 1, wherein the gap is between approximately 10 nm to approximately 500 nm.

6. The apparatus of claim 1, wherein the apparatus is disposed in an inert medium.

7. The apparatus of claim 6, wherein the inert medium is nitrogen or argon.

* * * * *